(12) United States Patent
Chen et al.

(10) Patent No.: US 7,054,122 B2
(45) Date of Patent: May 30, 2006

(54) VDDCORE TO VSS ESD CLAMP MADE OF CORE DEVICE

(75) Inventors: Chung-Hui Chen, Tainan (TW); Hun-Hsien Chang, Taipei Hsien (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 501 days.

(21) Appl. No.: 10/383,424

(22) Filed: Mar. 7, 2003

(65) Prior Publication Data
US 2003/0227726 A1  Dec. 11, 2003

(30) Foreign Application Priority Data
Jun. 11, 2002 (TW) .............................. 91112701 A

(51) Int. Cl.
*H02H 9/00* (2006.01)
(52) U.S. Cl. ........................................ 361/56; 361/111
(58) Field of Classification Search .................. 361/56, 361/111
See application file for complete search history.

(56) References Cited

U.S. PATENT DOCUMENTS 6,384,628 B1 * 5/2002 Lacey et al. .................. 326/41
6,624,998 B1 * 9/2003 May et al. .................. 361/111

* cited by examiner

*Primary Examiner*—Stephen W. Jackson
(74) *Attorney, Agent, or Firm*—Thomas. Kayden, Horstemeyer & Risley

(57) ABSTRACT

The present invention comprises an ESD clamp circuit used in an integrated circuit with plural power supply. The ESD clamp circuit, connected between core voltage source and low voltage source, is fabricated by a process which fabricates core circuit. The ESD clamp circuit has a low trigger voltage, so it can conduct large current to protect the core circuit before the core circuit is damaged.

5 Claims, 3 Drawing Sheets

VDDCORE TO VSS ESD CLAMP MADE OF CORE DEVICE

BACKGROUND OF THE INVENTION

1. Field of the Invention

The present invention in general relates to a semiconductor technology, More specifically, the present invention relates to electrostatic discharge clamp circuits for providing an electrostatic discharge current path before electrostatic discharge current flow through a core device to keep the core device from being destroyed.

2. Description of the Related Art

Different voltage levels are applied to I/O and core devices, and the voltage level of the I/O devices is usually higher than that of the core devices. Usually, MOS components of the I/O devices have thicker oxide thickness, deeper source/drain junction. Therefore, the I/O devices are more immune to ESD zap. This is the reason why use the I/O devices as an ESD clamp circuit. In deep submicron technology, core devices are drawn with minimum dimension and spacing that they have lower breakdown voltage and are easier damaged by ESD zap. However the conventional ESD protection circuits implemented by I/O devices require higher trigger voltage, and can not effectively bypass the electrostatic discharge currents before ESD damage the core circuits.

FIG. 1 shows a conventional ESD protection scheme and an ESD current path for a whole chip. As shown in FIG. 1, clamp circuit 2 is connected between input-output voltage source VDDIO and low voltage source VSS. Pull up clamp circuit 4 is connected between pad 1 and input-output voltage source VDDIO. Clamp circuit 6 is connected between pad 1 and low voltage source VSS. Clamp circuit 8 is connected between input-output voltage source VDDIO and core voltage source VDDCORE. Core circuit 30 is connected between core voltage source VDDCORE and low voltage source VSS. And conventional clamp circuit 20 is connected between core voltage source VDDCORE and low voltage source VSS. Clamp circuit 20, which is used as a protection circuit to prevent ESD current flow through core circuit 30, is fabricated by a process that fabricates I/O device.

As shown in FIG. 1, ESD current path 100 illustrates the prior art ESD current path in an integrated circuit. Because clamp circuit 20 connected between core voltage source VDDCORE and low voltage source VSS is fabricated by a process which fabricates I/O device, its trigger voltage is high. And it can not turn on conducting ESD current before core circuit 30 is destroyed that ESD current punch through core circuit 30 and conduct to low voltage source VSS. When a positive ESD voltage is applied to pad 1 and input-output voltage source VDDIO and core voltage source VDDCORE are both floating, the ESD current is conducted into input-output voltage source VDDIO through pull up clamp circuit 4, which is connected between pad 1 and input-output voltage source VDDIO. And then the ESD current is conducted into core voltage source VDDCORE through clamp circuit 8, which is connected between input-output voltage source VDDIO and core voltage source VDDCORE. Because core circuit 30 has device dimensions and layout spacings smaller than that of clamp circuit 20, it is vulnerable to ESD zap before clamp circuit 20 turn on conducting ESD current. So the ESD current path 100 conducts into low voltage source VSS through core circuit 30, and then conducts into another pad through low voltage source VSS.

SUMMARY OF THE INVENTION

Therefore, an object of the present invention is to provide an integrated circuit, which can bypass ESD current before ESD overstress voltage damage core circuit and effectively prevent core circuit from ESD zap.

The present invention achieves the above-indicated objectives by providing an integrated circuit, comprising core voltage source, input-output voltage source, low voltage source, core circuit, the first clamp circuit, and the second clamp circuit. The first clamp circuit is connected between core voltage source and low voltage source. The second clamp circuit is connected between input-output voltage source and core voltage source. The first clamp circuit is fabricated by a process which fabricates core circuit. During ESD zap, because the trigger voltage of the first clamp circuit is low, it can start conducting a large current before ESD damage core circuit, and clamped the voltage across core voltage source and low voltage source in safe region.

BRIEF DESCRIPTION OF THE DRAWINGS

The present invention can be more fully understood by reading the subsequent detailed description in conjunction with the examples and references made to the accompanying drawings, wherein.

DETAILED DESCRIPTION OF THE PREFERRED EMBODIMENT

The present invention discloses a new ESD clamp circuit, which is fabricated by a process which fabricates core circuit, can effectively bypass ESD current to protect core circuit. In the subsequently embodiment, the performance of the clamp circuit is illustrated by ESD current path in the whole chip, and the schematic diagram of the clamp circuit is illustrated.

The First Embodiment

Figure 1:
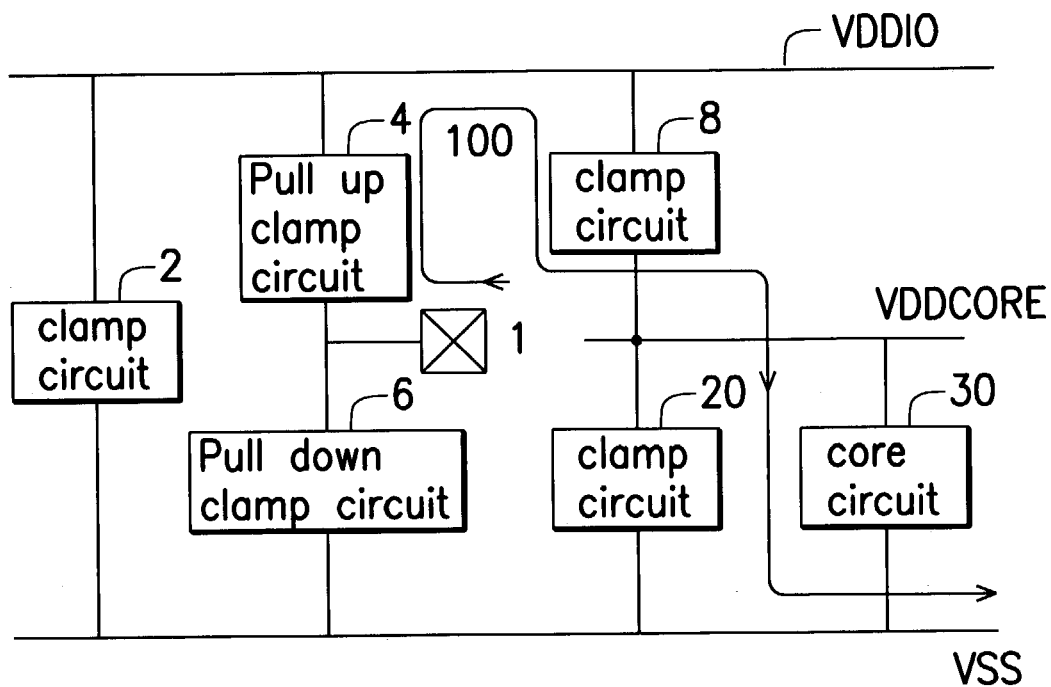
FIG. 1 (PRIOR ART) is a block diagram of an ESD protection circuit for a whole chip of the prior art.
Figure 2:
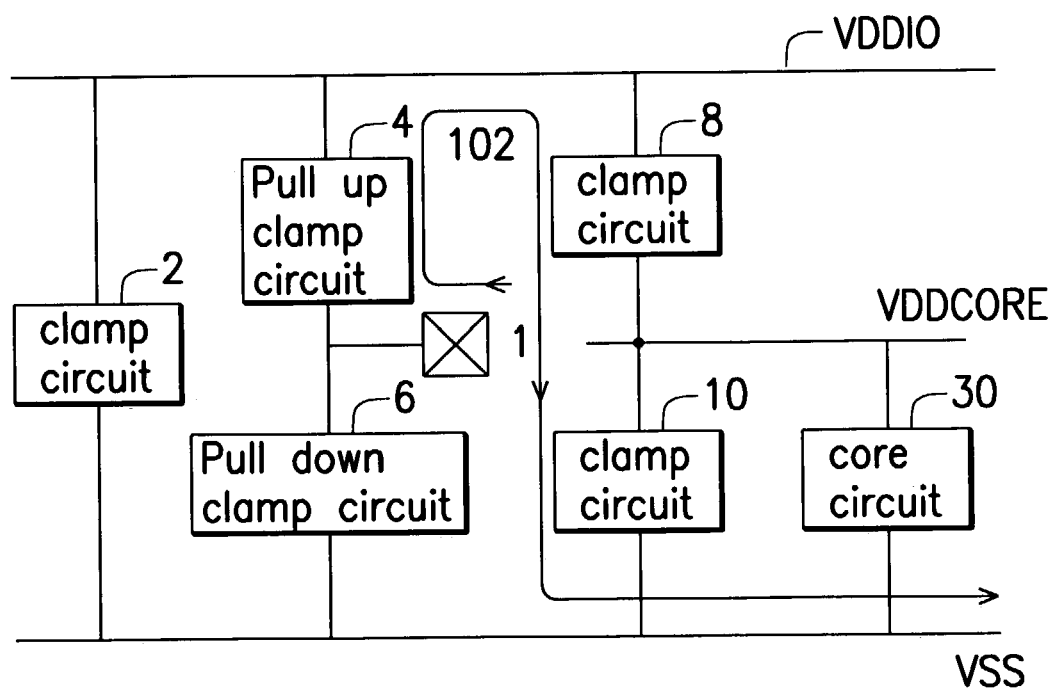
FIG. 2 is a block diagram of an ESD protection circuit for a whole chip of the present invention.

FIG. 2 shows a block diagram of an ESD protection circuit for a whole chip of the present invention. Clamp circuit 2 is connected between input-output voltage source VDDIO and low voltage source VSS. Designation 1 represents pad. Pull up clamp circuit 4 is connected between input-output voltage source VDDIO and pad 1. Pull down clamp circuit 6 is connected between pad 1 and low voltage source VSS. Clamp circuit 8 is connected between input-output voltage source VDDIO and core voltage source VDDCORE. Clamp circuit 10 is connected between core voltage source VDDCORE and low voltage source VSS.

Core circuit 10 is connected between core voltage source VDDCORE and low voltage source VSS.

The ESD current path 102 of FIG. 2 illustrates the actual ESD current path in the integrated circuit of the present invention. Because clamp circuit 10, which is connected between core voltage source VDDCORE and low voltage source VSS, is fabricated by a process which fabricates core circuit 30, it has trigger voltage lower than that of the conventional clamp circuit 20 and it can turn on bypassing ESD current before core circuit 30 is damaged by ESD zap. When a positive ESD voltage is applied to pad 1 and input-output voltage source VDDIO and core voltage source VDDCORE are both floating, the ESD current is conducted into input-output voltage source VDDIO through pull up clamp circuit 4, which is connected between pad 1 and input-output voltage source VDDIO. Subsequently, the ESD current is conducted into core voltage source VDDCORE through clamp circuit 8, which is connected between input-output voltage source VDDIO and core voltage source VDDCORE. Subsequently, the ESD current is conducted into low voltage source VSS through clamp circuit 10, which is connected between core voltage source VDDCORE and low voltage source VSS. The last, the ESD current is conducted into another pad through low voltage source.

Figure 3:
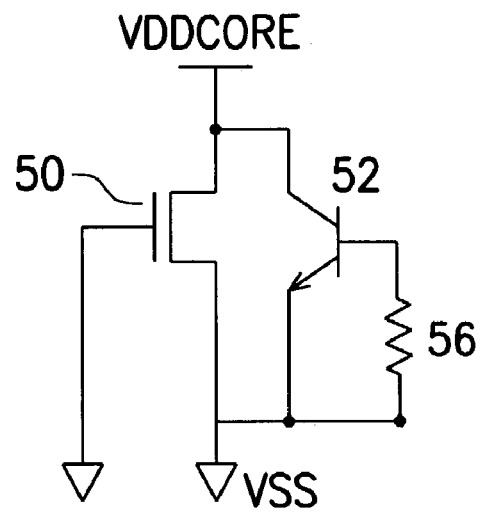
FIG. 3 is a schematic diagram of an ESD protection circuit between core power supply and low-voltage power supply in accordance with the embodiment of the present invention.

With reference to FIG. 3, there is shown a schematic diagram of clamp circuit 10 of the present invention. Clamp circuit 10 is implemented by a ground gate NMOS 50 (N type MOSFET). NPN transistor 52 is a parasitic bipolar transistor of NMOS 50. Resistor 56 is a parasitic resistor of NMOS 50. Because the gate electrode is grounded, NMOS 50 does not turn on in normal operation. During ESD zap, a snapback action of NPN transistor 52 occurs, which conducts large current and effectively clamp core voltage source in low voltage.

Figure 4:
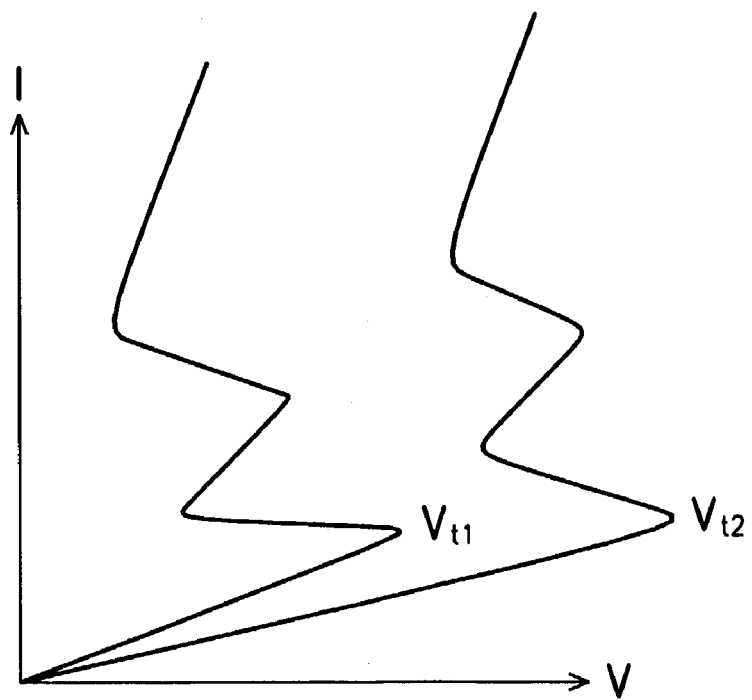
FIG. 4 shows a characteristic curve of a NMOS and a characteristic curve of a conventional NMOS.

NMOS 50 is fabricated by the process which fabricates core circuit 30, so its gate oxide is thin and drain/gate breakdown voltage is low. FIG. 4 shows a characteristic curve of a NMOS 50 and a characteristic curve of a conventional NMOS. The trigger voltage $V_{t1}$ of NMOS 50 is lower than the trigger voltage $V_{t2}$ of conventional NMOS, so NMOS 50 can turn on bypassing ESD current before ESD damages the core circuit 30.

Accordingly, the clamp circuit in the embodiment is fabricated by the process which fabricates core circuit that it can clamp voltage across core circuit in safe region.

The Second embodiment

Figure 5:
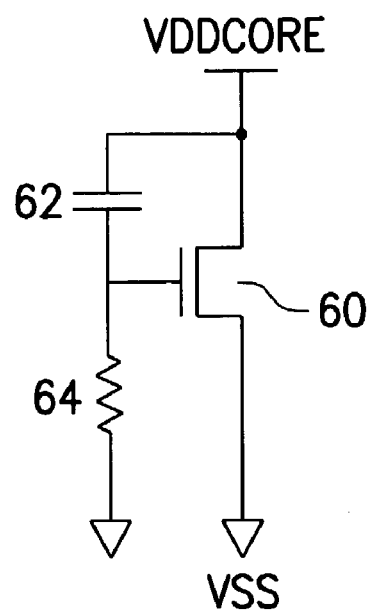
FIG. 5 is a schematic diagram of an ESD protection circuit between core power supply and low-voltage power supply in accordance with the embodiment of the present invention.
Figure 6:
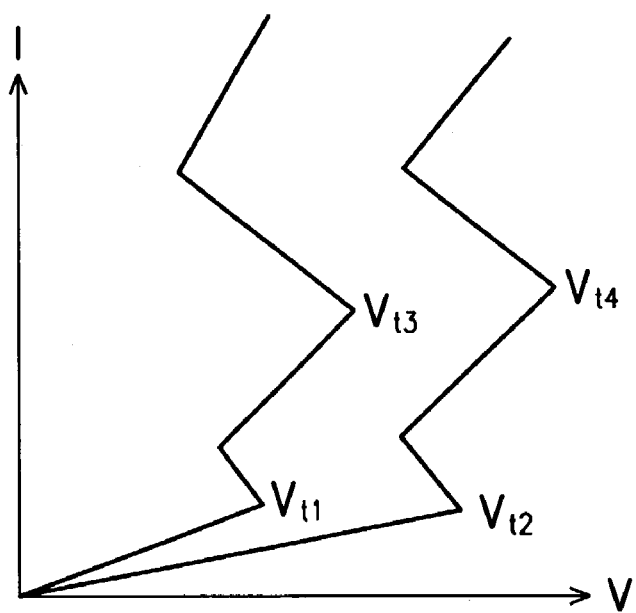
FIG. 6 shows a characteristic curve of a NMOS and a characteristic curve of a conventional NMOS.

FIG. 5 illustrates an another schematic diagram of the clamp circuit 10 of the present embodiment. It is implemented by a gate-couple NMOS 60, a capacitor 62, and a resistor 64 to sense ESD voltage. Capacitor 62 couples ESD charge to the gate of NMOS 60 that NMOS 60 weakly turn on and lower the trigger voltage. As shown in FIG. 6, the trigger voltage $V_{t1}$ of NMOS 60 is lower than second breakdown voltage $V_{t3}$ owing to capacitor 62, all fingers of NMOS 60 will snapback without some fingers go into second breakdown voltage and concentrated current. Capacitor 62 allows NMOS 60 conduct large and uniform current that effectively clamp core power supply in low voltage.

NMOS 60 is fabricated by the process which fabricates core circuit 30, its gate oxide is thin and trigger voltage is low. FIG. 6 shows a characteristic curve of a NMOS 60 and a characteristic curve of a conventional NMOS. The trigger voltage $V_{t1}$ of NMOS 60 is lower than the trigger voltage $V_{t2}$ of conventional NMOS, so NMOS 60 can turn on bypassing ESD current before ESD damages the core circuit 30.

Accordingly,; the clamp circuit in the embodiment is fabricated by the process which fabricates core circuit that it can clamp voltage across core circuit in safe region.

While the invention has been described with reference to various illustrative embodiments, the description is not intended to be construed in a limiting sense. Various modifications of the illustrative embodiments, as well as other embodiments of the invention, will be apparent to those persons skilled in the art upon reference to this description. It is therefore contemplated that the appended claims will cover any such modification or embodiments as may fall within the scope of the invention defined by the following claims and their equivalents.

What is claimed is:

1. An interated circuit, comprising:
   a core voltage source;
   an input-output voltage source;
   a low voltage source;
   a core circuit having a first end coupled to the core voltage source and a second end coupled to the low voltage source;
   a first clamp circuit having a first end coupled to the core voltage source and a second end coupled to the low voltage source;
   a second clamp circuit having a first end coupled to the input-output voltage source and a second end coupled to the core voltage source;
   a pad;
   a pull up clamp circuit having a first end coupled to the input-output voltage source and a second end coupled to the pad;
   a pull down clamp circuit having first end coupled to the pad and a second end coupled to the low voltage source;
   wherein the first clamp circuit is fabricated by a process which fabricates the core circuit to avoid an electrostatic discharge current passing through the core circuit; and
   wherein the pull up clamp circuit and the pull down clamp circuit are for providing an electrostatic discharge current path.

2. The integrated circuit as claimed in claim 1, wherein the first clamp circuit comprises a NMOS transistor, which is fabricated by the process which fabricates the core circuit, having thin gate oxide, gate and source both coupled to low voltage source, drain coupled to core voltage source.

3. The integrated circuit as claimed in claim 1, wherein the first clamp circuit comprises:
   a NMOS transistor, which is fabricated by the process which fabricates the core circuit, having thin gate oxide, source coupled to low-voltage, drain coupled to core voltage source;
   a resistor connected between the gate of the NMOS transistor and the low voltage source; and
   a capacitor connected between the gate of the NMOS transistor and the core voltage source.

4. The integrated circuit as claimed in claim 1, further comprising a third clamp circuit having a first end coupled to the input-output voltage source and a second end coupled to the low voltage source.

5. An integrated circuit, comprising:
   a core voltage source;
   an input-output voltage source;
   a low voltage source;

a core circuit having a first end coupled to the core voltage source and a second end coupled to the low voltage source;

a first clamp circuit having a first end coupled to the core voltage source and a second end coupled to the low voltage source;

a second clamp circuit having a first end coupled to the input-output voltage source and a second end coupled to the core voltage source; and a third clamp circuit having a first end coupled to the input-output voltage source and a second end coupled to the low voltage source;

wherein the first clamp circuit is fabricated by a process which fabricates the core circuit to avoid an electrostatic discharge current passing through the core circuit.

* * * * *